United States Patent
Omori et al.

(10) Patent No.: US 12,051,596 B2
(45) Date of Patent: Jul. 30, 2024

(54) HEAT TREATMENT METHOD AND HEAT TREATMENT APPARATUS

(71) Applicant: SCREEN Holdings Co., Ltd., Kyoto (JP)

(72) Inventors: Mao Omori, Kyoto (JP); Yasuaki Kondo, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 471 days.

(21) Appl. No.: 17/195,726

(22) Filed: Mar. 9, 2021

(65) Prior Publication Data

US 2021/0296141 A1    Sep. 23, 2021

(30) Foreign Application Priority Data

Mar. 23, 2020  (JP) .................................. 2020-051418

(51) Int. Cl.
*H01L 21/67*  (2006.01)

(52) U.S. Cl.
CPC .. *H01L 21/67017* (2013.01); *H01L 21/67098* (2013.01); *H01L 21/67115* (2013.01)

(58) Field of Classification Search
CPC ......... H01L 21/67115; H01L 21/67098; H01L 21/67; H01L 21/02
See application file for complete search history.

(56) References Cited

U.S. PATENT DOCUMENTS

| | | | |
|---|---|---|---|
| 5,584,963 A | * | 12/1996 | Takahashi ........... C23C 16/4412 134/31 |
| 5,633,212 A | * | 5/1997 | Yuuki ............... H01L 21/02238 257/E21.285 |
| 6,383,946 B1 | | 5/2002 | Ying et al. |

(Continued)

FOREIGN PATENT DOCUMENTS

| | | |
|---|---|---|
| JP | H9-000909 A | 1/1997 |
| JP | 10001776 A  * | 1/1998 |

(Continued)

OTHER PUBLICATIONS

Notification of Reason for Refusal dated May 20, 2022 in corresponding Korean Patent Application No. 10-2021-0032566 and a computer-generated English translation obtained from the JPO.

(Continued)

*Primary Examiner* — Gregory A Wilson
(74) *Attorney, Agent, or Firm* — OSTROLENK FABER LLP

(57) ABSTRACT

Before supplying ammonia, which is a flammable gas, into a chamber, the chamber is evacuated to eliminate residual gas from the chamber, and then nitrogen is fed into a combustion-supporting gas line to cause oxygen, which is a combustion-supporting gas, remaining in the combustion-supporting gas line to flow out. After supplying ammonia into the chamber, the chamber is evacuated to eliminate the ammonia from the chamber, and then nitrogen is fed into a flammable gas line to cause the ammonia remaining in the flammable gas line to flow out. Oxygen or ammonia and (Continued)

nitrogen are alternately eliminated on the downstream side of an exhaust part, and it is therefore possible to prevent the flammable gas and the combustion-supporting gas from being mixed with each other.

10 Claims, 12 Drawing Sheets

(56) References Cited

U.S. PATENT DOCUMENTS

| | | | | |
|---|---|---|---|---|
| 11,322,375 | B2* | 5/2022 | Ueda | H01L 21/02164 |
| 2004/0266214 | A1 | 12/2004 | Suguro et al. | |
| 2007/0212847 | A1* | 9/2007 | Ingle | H01L 21/76224 |
| | | | | 257/E21.546 |
| 2009/0075490 | A1* | 3/2009 | Dussarrat | H01L 21/0228 |
| | | | | 257/E21.24 |
| 2009/0130859 | A1* | 5/2009 | Itatani | C23C 16/0272 |
| | | | | 257/E21.24 |
| 2011/0108128 | A1* | 5/2011 | Kishimoto | C23C 16/45561 |
| | | | | 137/12 |

FOREIGN PATENT DOCUMENTS

| | | | |
|---|---|---|---|
| JP | 2003-031507 A | | 1/2003 |
| JP | 2003031507 A | * | 1/2003 |
| JP | 2005-019650 A | | 1/2005 |
| JP | 2012-023138 A | | 2/2012 |
| JP | 5274557 B2 | | 8/2013 |

OTHER PUBLICATIONS

Notice of Reasons for Refusal dated Sep. 26, 2023 in corresponding Japanese Patent Application No. 2020-051418 and a computer-generated English translation obtained from the JPO.

* cited by examiner

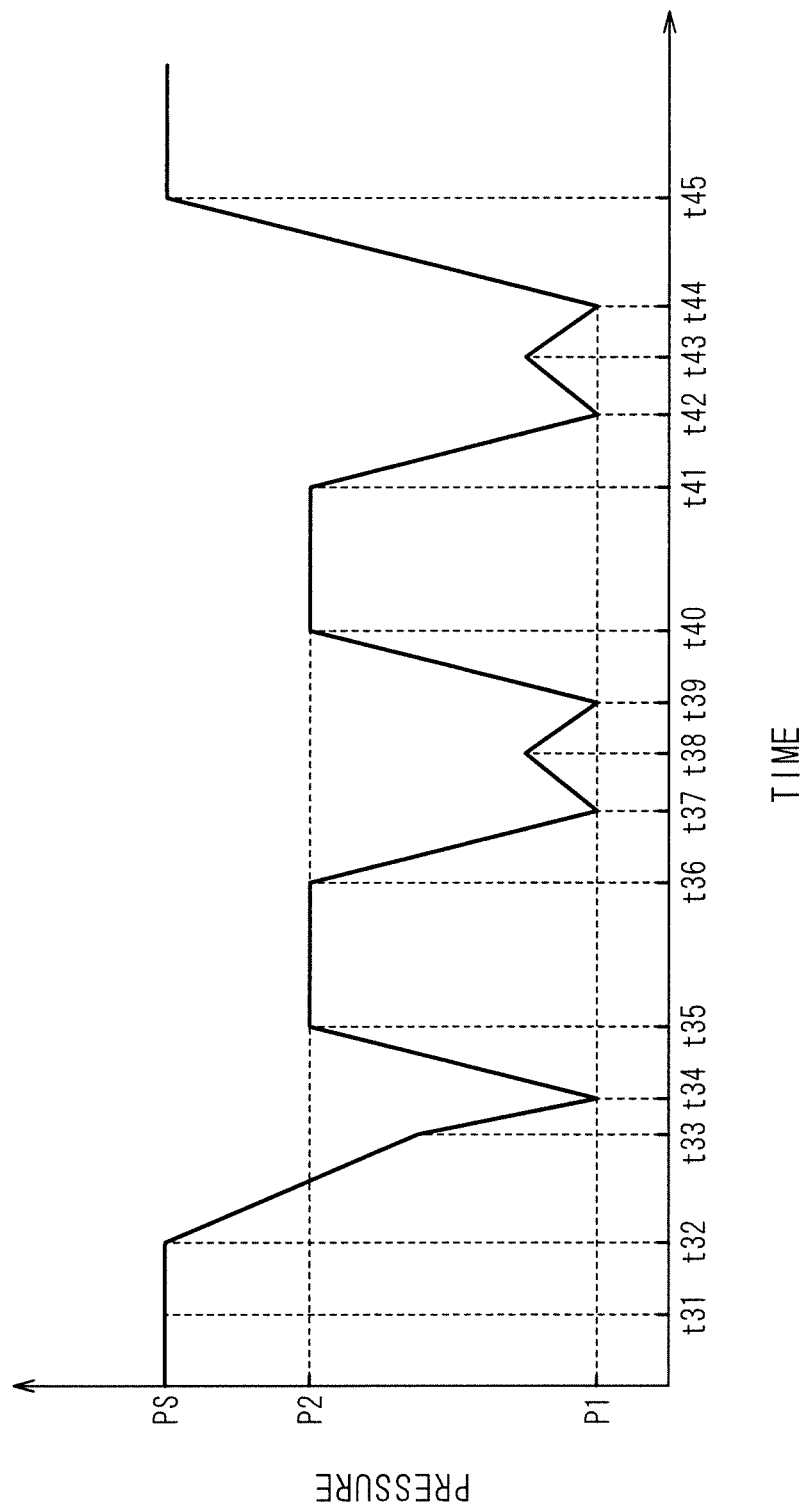

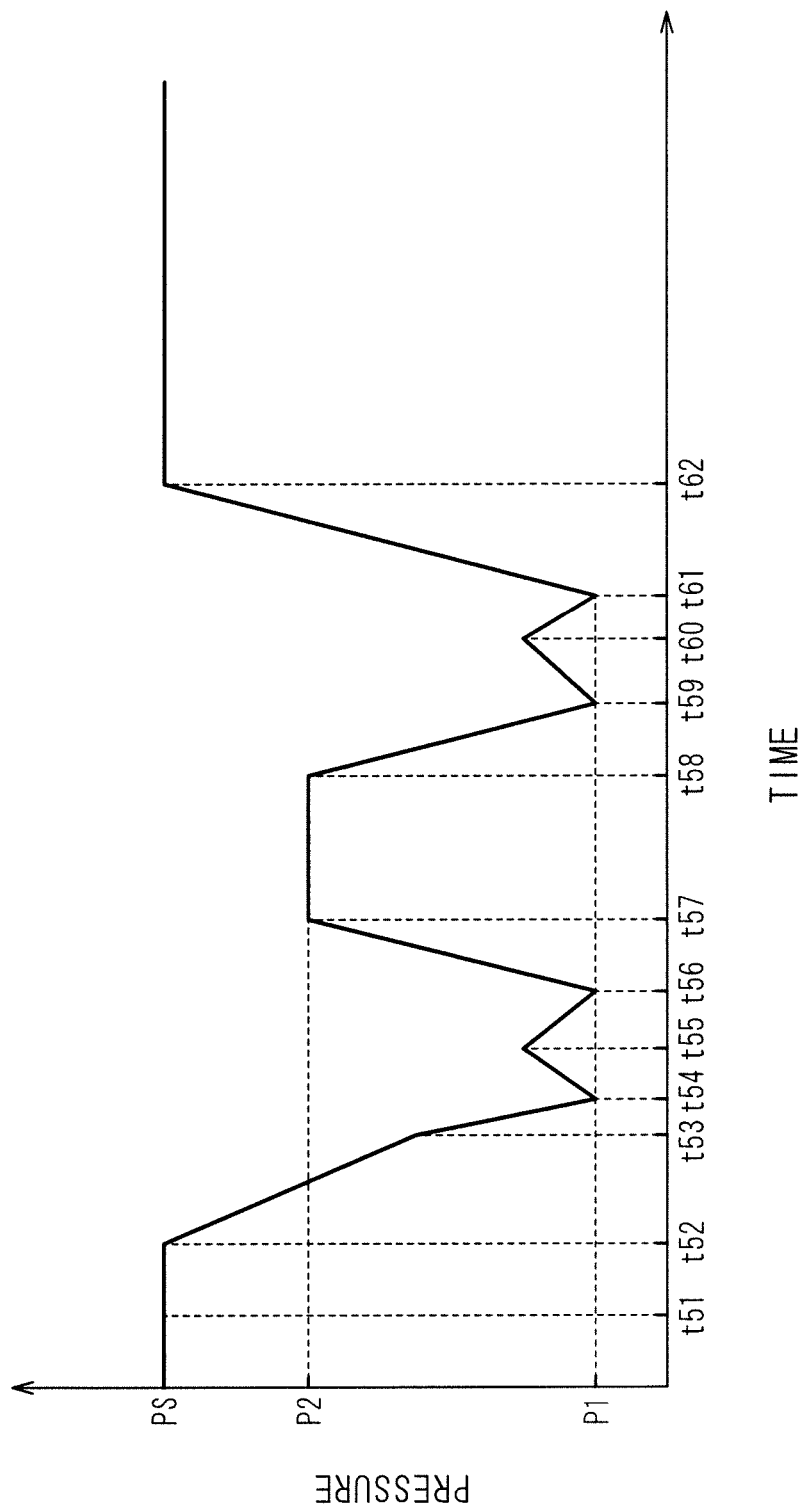

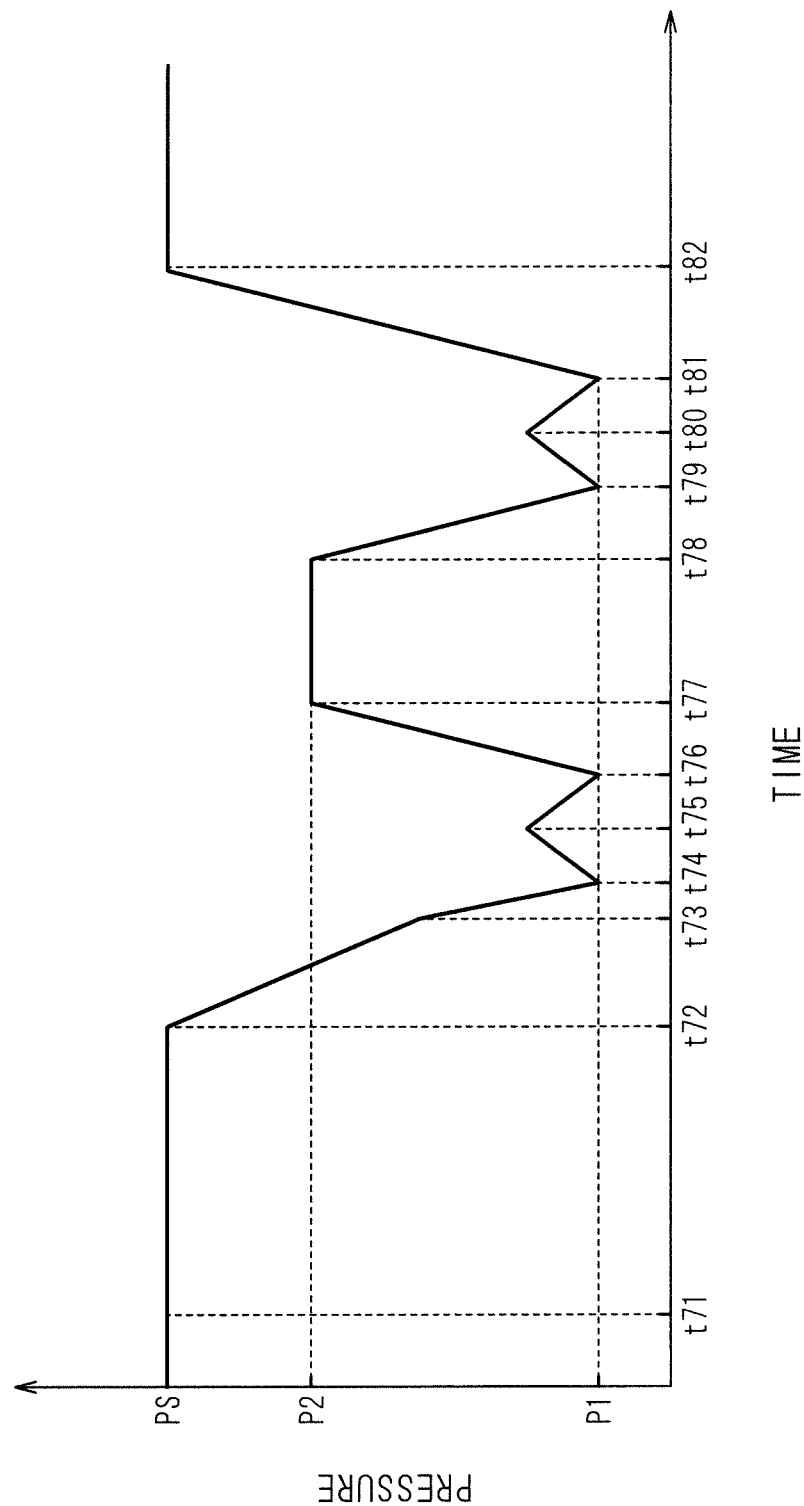

HEAT TREATMENT METHOD AND HEAT TREATMENT APPARATUS

BACKGROUND OF THE INVENTION

Field of the Invention

The present invention relates to a heat treatment method and a heat treatment apparatus which heat a thin plate-like precision electronic substrate (hereinafter referred to simply as a "substrate") such as a semiconductor wafer in a flammable gas atmosphere and a combustion-supporting gas atmosphere.

Description of the Background Art

As a manufacturing process of semiconductor devices, flash lamp annealing (FLA), by which a semiconductor wafer is heated in an extremely short time has attracted attention. Flash lamp annealing is a heat treatment technique by which a xenon flash lamp (hereinafter, a simple term of "flash lamp" means the xenon flash lamp) is used to irradiate the front surface of the semiconductor wafer with flashes of light so as to increase only the temperature of the front surface of the semiconductor wafer in an extremely short time (several milliseconds or less).

The xenon flash lamp has a radiation spectral distribution lying in a region ranging from the ultraviolet region to a near infrared region and has a wavelength shorter than the wavelength of any conventional halogen lamp, which is almost the same as a basic absorption band of a silicon semiconductor wafer. Therefore, when the semiconductor wafer is irradiated with flashes of light from the xenon flash lamp, it is possible to rapidly increase, with little transmitted light, the temperature of the semiconductor wafer. It has also been proved that the flashes of light emitted in an extremely short time of several milliseconds or less can selectively increase only the temperature of an area in the vicinity of the front surface of the semiconductor wafer.

Such flash lamp annealing is applied to processes that require heating in an extremely short time such as, as a typical example, activation of impurities with which the semiconductor wafer is doped. Irradiating, with flashes of light emitted from the flash lamp, the front surface of the semiconductor wafer doped with impurities by ion implantation makes it possible to increase the temperature of the front surface of the semiconductor wafer to the activation temperature only for an extremely short time and in turn makes it possible to cause only the activation of impurities without deeply diffusing the impurities.

Attempts have also been made to perform heating treatment in various gas atmospheres in a flash lamp annealer. For example, irradiating a semiconductor wafer on which a high dielectric constant film (High-k film) is formed with flashes of light in an ammonia atmosphere to nitride the high dielectric constant film has been made. Irradiating a silicon semiconductor wafer with flashes of light in an oxygen atmosphere to form an oxide film has also been made. Further, oxidation treatment in an oxygen atmosphere and nitriding treatment in an ammonia atmosphere may be performed consecutively in this order, or alternatively, nitriding treatment in an ammonia atmosphere and oxidation treatment in an oxygen atmosphere may be performed consecutively in this order.

However, ammonia is a flammable gas, and oxygen is a combustion-supporting gas (combustion-aid gas). It is therefore dangerous to mix ammonia, which is a flammable gas, and oxygen, which is a combustion-supporting gas, in the apparatus when the oxidation treatment and the nitriding treatment are consecutively performed. For this reason, for example, Japanese Patent Application Laid-Open No. 2003-31507 discloses a technique for individually exhausting a flammable gas and a combustion-supporting gas remaining in an apparatus to prevent the flammable gas and the combustion-supporting gas from being mixed and reacting with each other.

However, even when being individually exhausted, the flammable gas and the combustion-supporting gas may be mixed with each other on the downstream side of an exhaust part. Specifically, for example, when the combustion-supporting gas is exhausted immediately after the flammable gas is exhausted, the flammable gas and the combustion-supporting gas are not mixed in the apparatus, but may be mixed on the downstream side of the exhaust part.

SUMMARY

The present invention is intended for a heat treatment method of heating a substrate.

According to one aspect of the present invention, the heat treatment method includes the steps of: (a) putting a substrate into a chamber; (b) causing an exhaust part to exhaust gas from the chamber to eliminate residual gas from the chamber; (c) after the step (b), feeding nitrogen into a combustion-supporting gas line connected to the chamber to cause a combustion-supporting gas remaining in the combustion-supporting gas line to flow out; (d) after the step (c), supplying a flammable gas into the chamber through a flammable gas line connected to the chamber to form a flammable gas atmosphere; (e) heating the substrate in the flammable gas atmosphere; (f) after the step (e), causing the exhaust part to exhaust gas from the chamber to eliminate the flammable gas from the chamber; and (g) after the step (f), feeding nitrogen into the flammable gas line to cause the flammable gas remaining in the flammable gas line to flow out.

This causes the combustion-supporting gas or the flammable gas and the nitrogen to be alternately exhausted on the downstream side of the exhaust part, which makes it possible to prevent the flammable gas and the combustion-supporting gas from being mixed with each other at the downstream side of the exhaust part.

The present invention is also intended for a heat treatment apparatus for heating a substrate.

According to one aspect of the present invention, the heat treatment apparatus includes: a chamber for receiving a substrate therein; a heating part for performing heating treatment on the substrate received in the chamber; an exhaust part for exhausting gas from the chamber; a combustion-supporting gas line for supplying a combustion-supporting gas into the chamber; a first purge part for feeding nitrogen into the combustion-supporting gas line to cause the combustion-supporting gas remaining in the combustion-supporting gas line to flow out; a flammable gas line for supplying a flammable gas into the chamber; and a second purge part for feeding nitrogen into the flammable gas line to cause the flammable gas remaining in the flammable gas line to flow out. In the heat treatment apparatus, before supplying the flammable gas into the chamber through the flammable gas line, the exhaust part exhausts gas from the chamber to eliminate residual gas from the chamber, and the first purge part feeds nitrogen into the combustion-supporting gas line to cause the combustion-supporting gas remaining in the combustion-supporting gas line to flow out, and after supplying the flammable gas into the chamber through the flammable gas line, the exhaust part exhausts gas from the chamber to eliminate the flammable gas from the chamber, and the second purge part feeds nitrogen into the flammable gas line to cause the flammable gas remaining in the flammable gas line to flow out.

This causes the combustion-supporting gas or the flammable gas and the nitrogen to be alternately exhausted on the downstream side of the exhaust part, which makes it possible to prevent the flammable gas and the combustion-supporting gas from being mixed with each other at the downstream side of the exhaust part.

Therefore, an object of the present invention is to prevent the flammable gas and the combustion-supporting gas from being mixed with each other at the downstream side of the exhaust part.

These and other objects, features, aspects and advantages of the present invention will become more apparent from the following detailed description of the present invention when taken in conjunction with the accompanying drawings.

BRIEF DESCRIPTION OF THE DRAWING

FIG. 12 is a diagram showing changes in pressure in a chamber of the second preferred embodiment;

FIG. 13 is a diagram showing changes in pressure in a chamber of a third preferred embodiment; and FIG. 14 is a diagram showing changes in pressure in a chamber of a fourth preferred embodiment.

DESCRIPTION OF THE PREFERRED EMBODIMENTS

Preferred embodiments according to the present invention will now be described in detail with reference to the drawings.

First Preferred Embodiment

Figure 1:
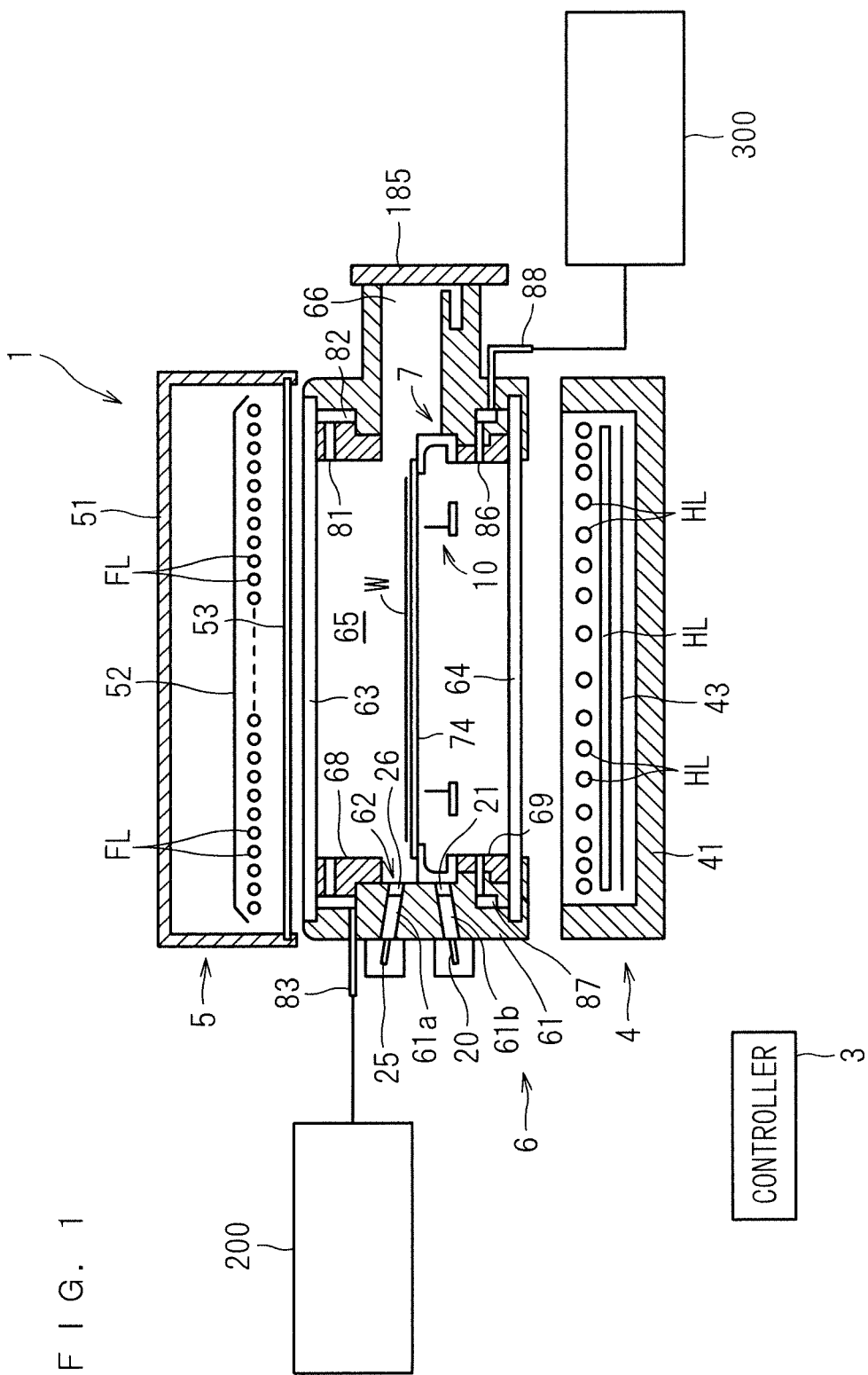
FIG. 1 is a longitudinal sectional view showing a configuration of a heat treatment apparatus according to the present invention.

First, a configuration of a heat treatment apparatus according to the present invention will be described. FIG. 1 is a longitudinal sectional view showing a configuration of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows made of quartz are mounted to the top and bottom, respectively, of a tubular chamber side portion 61. The chamber side portion 61 has a generally tubular shape having an open top and an open bottom. An upper chamber window 63 is mounted to block the top opening of the chamber side portion 61, and a lower chamber window 64 is mounted to block the bottom opening thereof. The upper chamber window 63 forming a ceiling of the chamber 6 is a disk-shaped member made of quartz, and serves as a quartz window that transmits flashes of light emitted from the flash heating part 5 therethrough into the chamber 6. The lower chamber window 64 forming a floor of the chamber 6 is also a disk-shaped member made of quartz, and serves as a quartz window that transmits light emitted from the halogen heating part 4 therethrough into the chamber 6.

An upper reflective ring 68 is mounted to an upper portion of an inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and are not mounted, a lower end surface of the reflective ring 68, and an upper end surface of the reflective ring 69. The recessed portion 62 is provided in the form of a horizontal annular ring in the inner wall surface of the chamber 6, and surrounds the holder 7 which holds a semiconductor wafer W. The chamber side portion 61 and the reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a and a through hole 61b bored therein. The through hole 61a is a cylindrical hole for directing infrared radiation emitted from an upper surface of a semiconductor wafer W held by a susceptor 74 to be described later therethrough to an upper radiation thermometer 25. On the other hand, the through hole 61b is a cylindrical hole for directing infrared radiation emitted from a lower surface of the semiconductor wafer W therethrough to a lower radiation thermometer 20. The through holes 61a and 61b are inclined with respect to a horizontal direction so that their respective longitudinal axes (axes extending in a direction in which the through holes 61a and 61b extend through the chamber side portion 61) intersect a main surface of the semiconductor wafer W held by the susceptor 74. A transparent window 26 made of calcium fluoride material transparent to infrared radiation in a wavelength range measurable with the upper radiation thermometer 25 is mounted to an end portion of the through hole 61a which faces the heat treatment space 65. The upper radiation thermometer 25 receives infrared radiation emitted from the upper surface of the semiconductor wafer W through the transparent window 26 to measure the temperature of the upper surface of the semiconductor wafer W, based on the intensity of the received infrared radiation. A transparent window 21 made of barium fluoride material transparent to infrared radiation in a wavelength range measurable with the lower radiation thermometer 20 is mounted to an end portion of the through hole 61b which faces the heat treatment space 65. The lower radiation thermometer 20 receives infrared radiation emitted from the lower surface of the semiconductor wafer W through the transparent window 21 to measure the temperature of the lower surface of the semiconductor wafer W, based on the intensity of the received infrared radiation.

A gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the annular form inside the side wall of the chamber 6. The gas supply pipe 83 is connected to a gas supply part 200. The treatment gas fed from the gas supply part 200 through the gas supply pipe 83 to flow into the buffer space 82 flows in a spreading manner within the buffer space 82 which is lower in fluid resistance than the gas supply opening 81, and is supplied through the gas supply opening 81 into the heat treatment space 65.

A gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the annular form inside the side wall of the chamber 6. The gas exhaust pipe 88 is connected to an exhaust part 300. The gas in the heat treatment space 65 is exhausted through the gas exhaust opening 86 and the buffer space 87 to the gas exhaust pipe 88, and is then exhausted by the exhaust part 300. The gas supply opening 81 and the gas exhaust opening 86 may include a plurality of gas supply openings 81 and a plurality of gas exhaust openings 86, respectively, arranged in a circumferential direction of the chamber 6, and may be in the form of slits.

Figure 2:
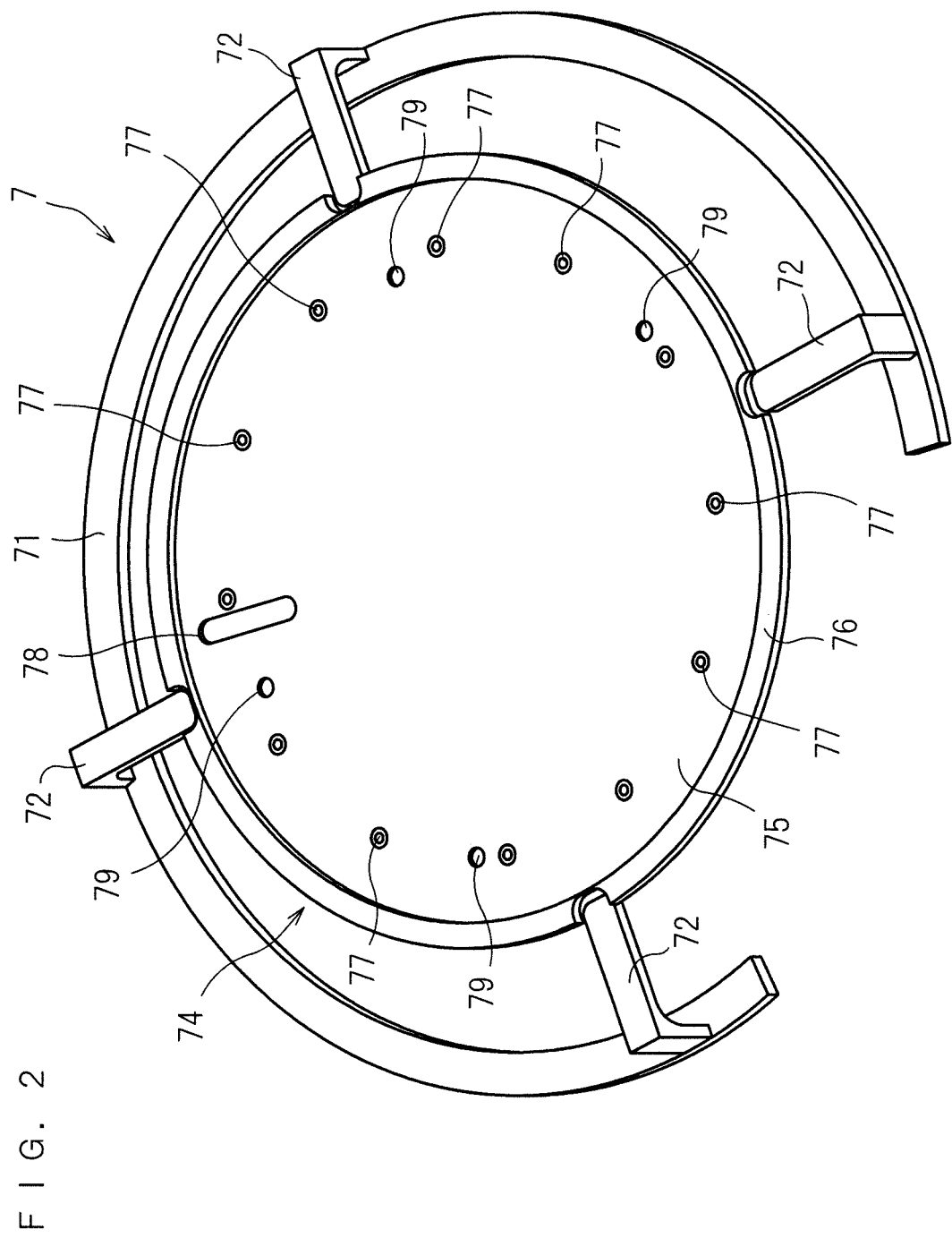
FIG. 2 is a perspective view showing an entire external appearance of a holder.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
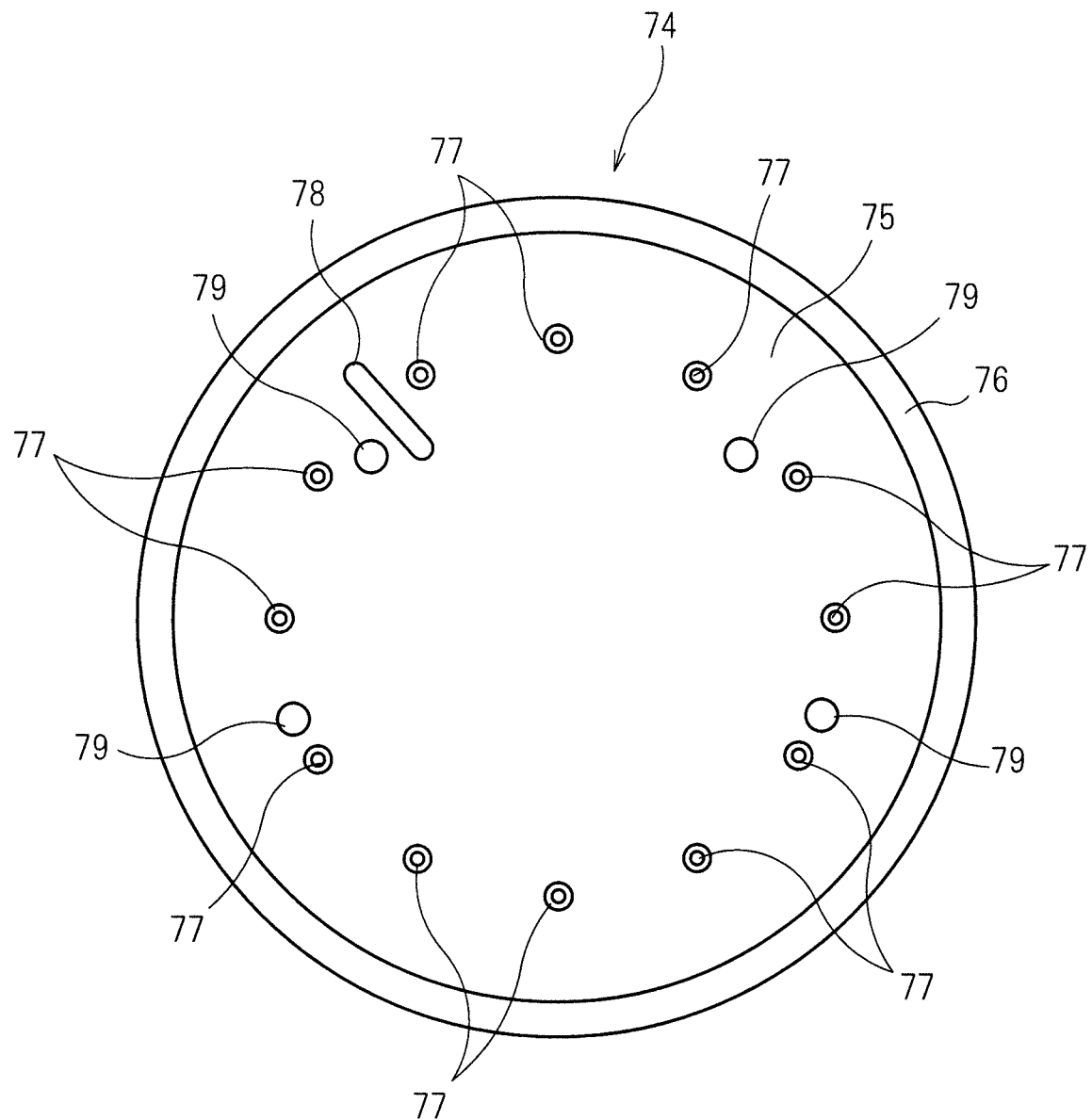
FIG. 3 is a plan view of a susceptor.
Figure 4:
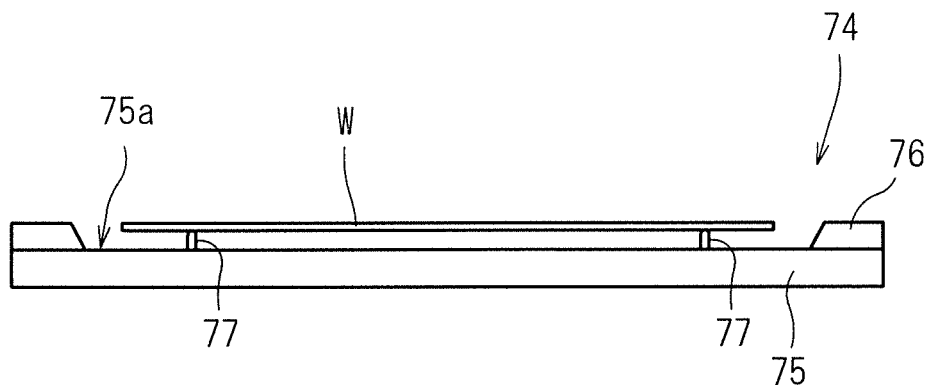
FIG. 4 is a sectional view of the susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal plane.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is provided in the holding plate 75 of the susceptor 74 so as to extend vertically through the holding plate 75 of the susceptor 74. The opening 78 is provided for the lower radiation thermometer 20 to receive radiation (infrared radiation) emitted from the lower surface of the semiconductor wafer W. Specifically, the lower radiation thermometer 20 receives the radiation emitted from the lower surface of the semiconductor wafer W through the opening 78 and the transparent window 21 mounted to the through hole 61b in the chamber side portion 61 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
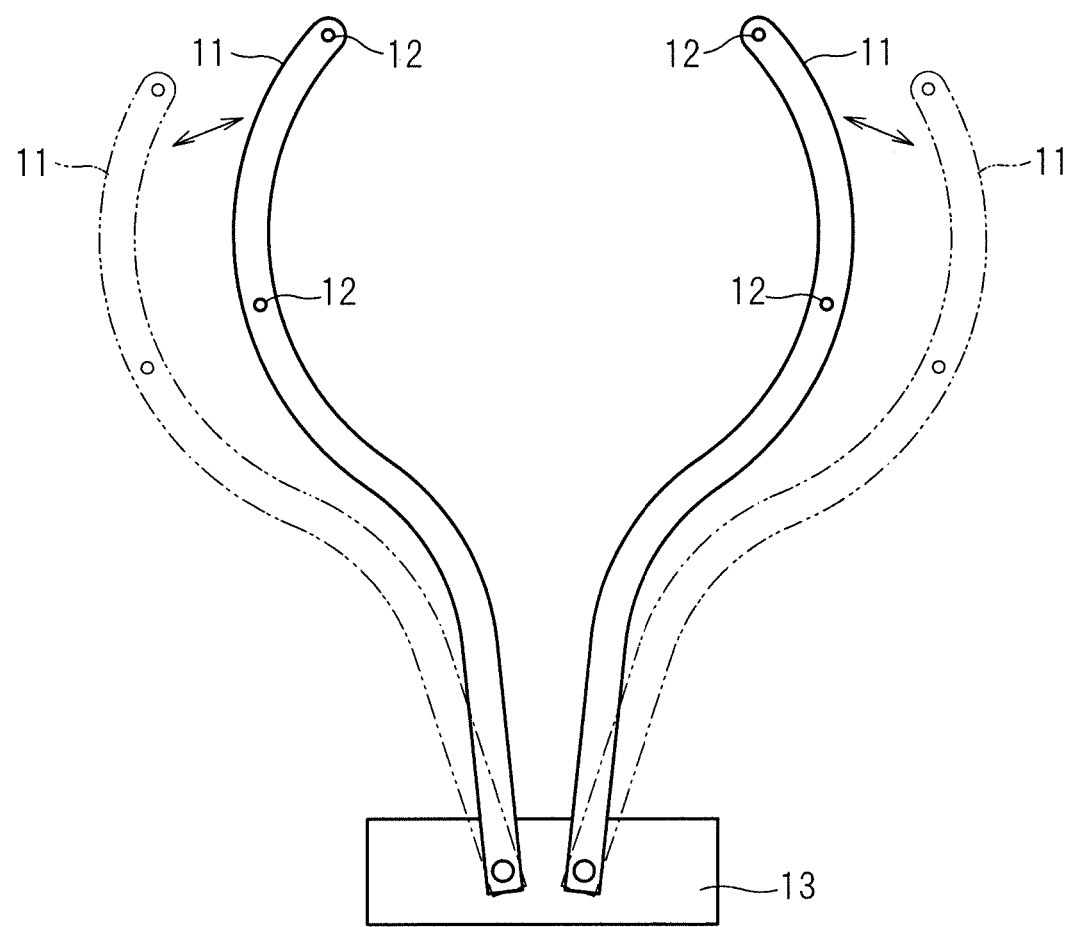
FIG. 5 is a plan view of a transfer mechanism.
Figure 6:
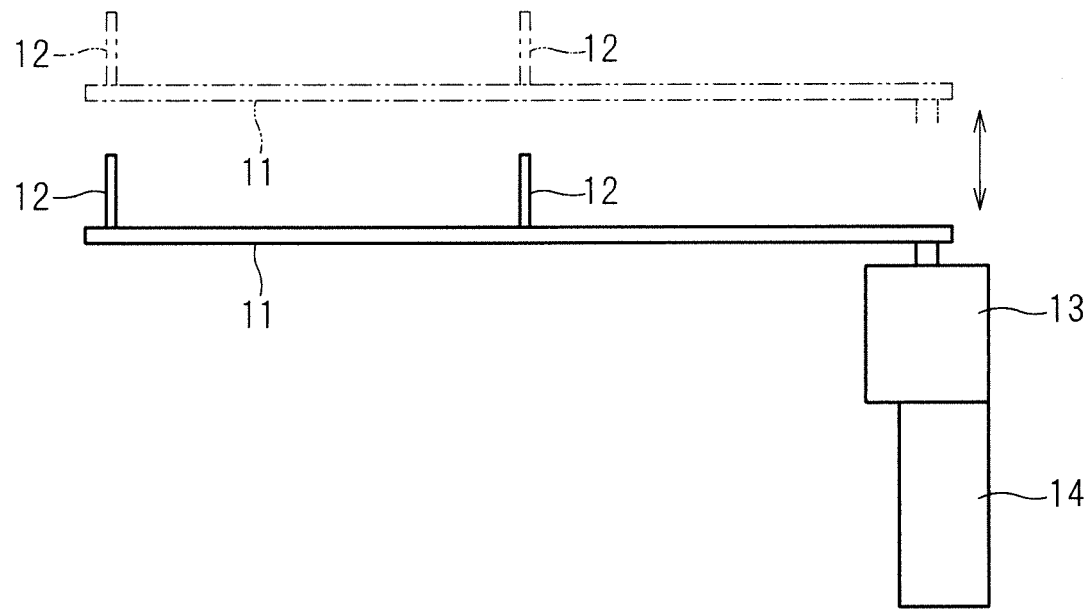
FIG. 6 is a side view of the transfer mechanism.

FIG. 5 is a plan view of the transfer mechanism 10. FIG. 6 is a side view of the transfer mechanism 10. The transfer mechanism 10 includes two transfer arms 11. The transfer arms 11 are of an arcuate configuration extending substantially along the annular recessed portion 62. Each of the transfer arms 11 includes two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The pair of transfer arms 11 is moved upwardly and downwardly together with the horizontal movement mechanism 13 by an elevating mechanism 14. As the elevating mechanism 14 moves up the pair of transfer arms 11 in their transfer operation position, four lift pins 12 in total pass through the respective four through holes 79 (with reference to FIGS. 2 and 3) bored in the susceptor 74, so that the upper ends of the lift pins protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the pair of transfer arms 11, the transfer arms 11 move to their retracted position. The retracted position of the pair of transfer arms 11 is immediately over the base ring 71 of the holder 7. The retracted position of the transfer arms 11 is inside the recessed portion because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the chamber 6 is provided with two radiation thermometers (pyrometers in the present preferred embodiment), the lower radiation thermometer 20 and the upper radiation thermometer 25. The lower radiation thermometer 20 is provided diagonally below a semiconductor wafer W held by the susceptor 74. The lower radiation thermometer 20 receives infrared radiation emitted from the lower surface of the semiconductor wafer W to measure the temperature of the lower surface based on the intensity of the received infrared radiation. On the other hand, the upper radiation thermometer 25 is provided diagonally above the semiconductor wafer W held by the susceptor 74. The upper radiation thermometer 25 receives infrared radiation emitted from the upper surface of the semiconductor wafer W to measure the temperature of the upper surface based on the intensity of the received infrared radiation. The upper radiation thermometer 25 is provided with an optical element made from indium antimonide (InSb) so as to be able to respond to, upon irradiation with flashes of light, a sudden change in temperature of the upper surface of the semiconductor wafer W.

The flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane. A region in which the flash lamps FL are arranged has a size, as seen in plan view, greater than that of the semiconductor wafer W.

Each of the xenon flash lamps FL includes a cylindrical glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure incorporating the multiple (in the present preferred embodiment, 40) halogen lamps HL. The halogen heating part 4 directs light from under the chamber 6 through the lower chamber window 64 toward the heat treatment space 65 to heat the semiconductor wafer W by means of the halogen lamps HL.

Figure 7:
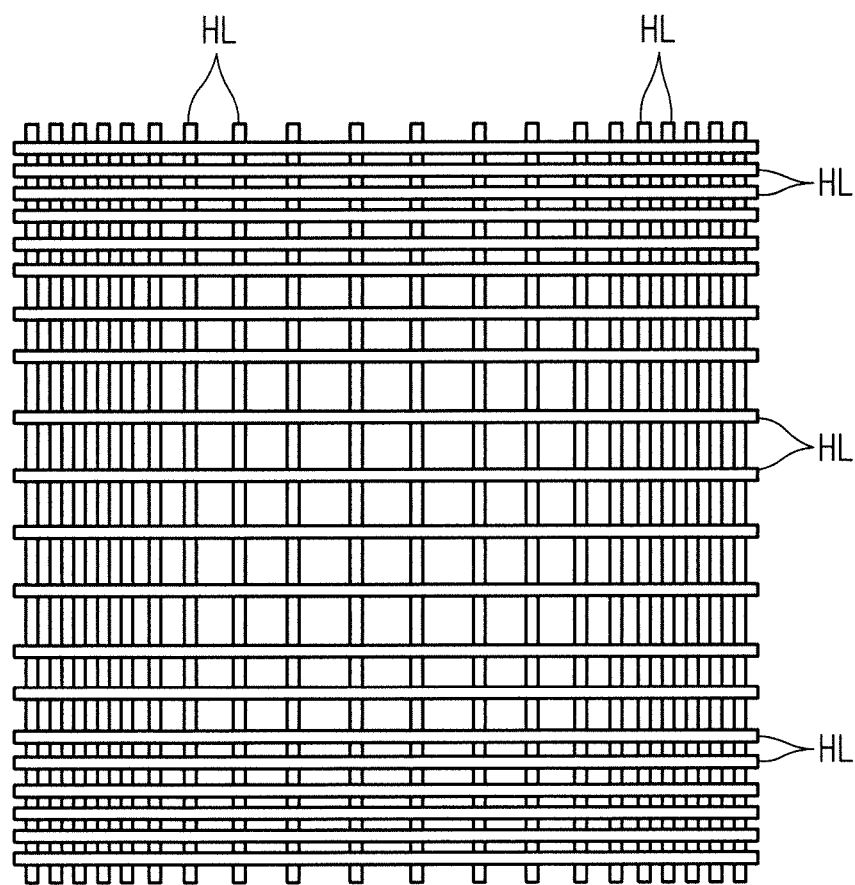
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in a peripheral portion of the lamp arrangement than in a central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

A group of halogen lamps HL in the upper tier and a group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

Figure 8:
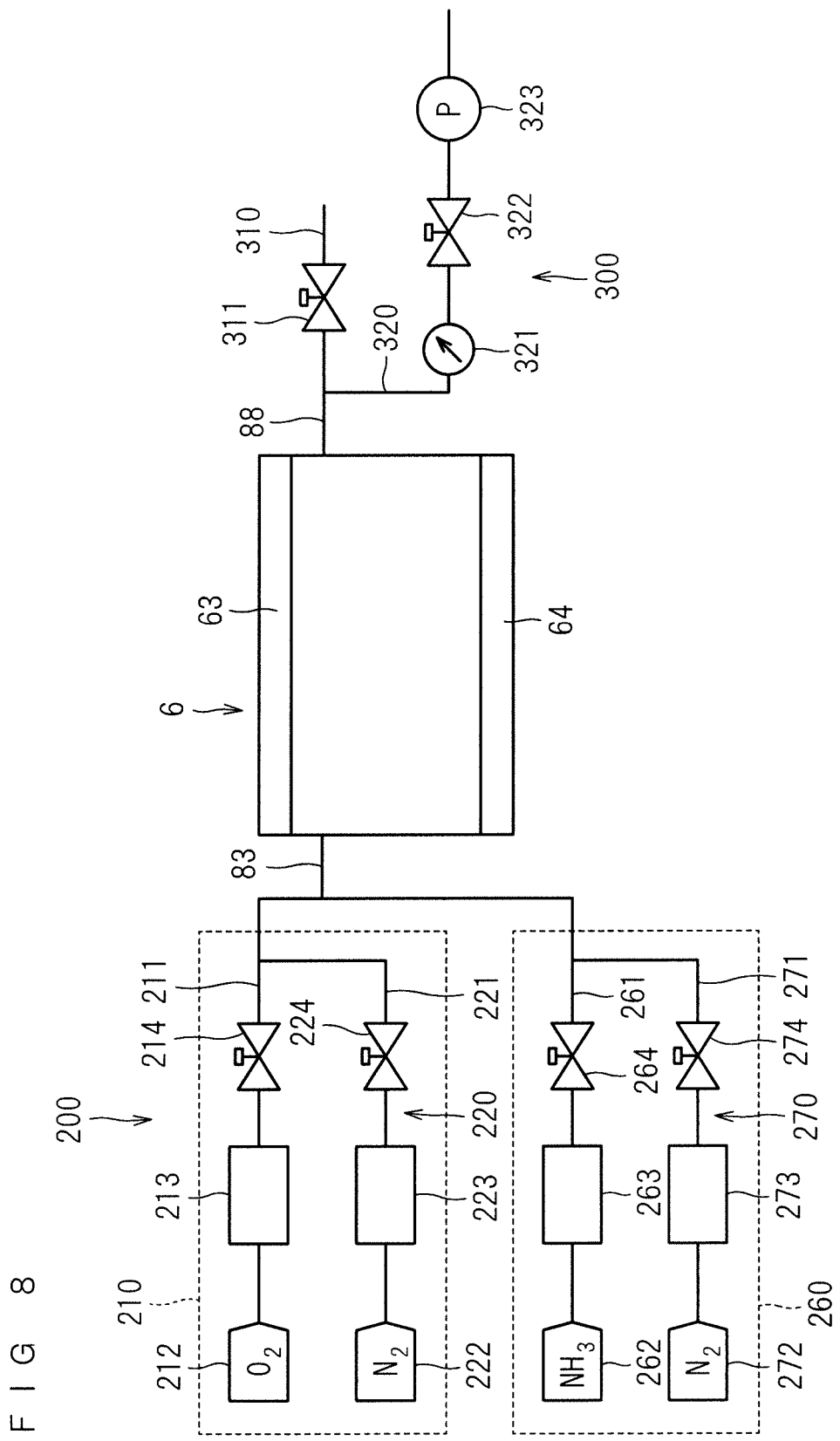
FIG. 8 is a diagram showing configuration of a gas supply part and a configuration of an exhaust part.

FIG. 8 is a diagram showing a configuration of the gas supply part 200 and a configuration of the exhaust part 300. The gas supply part 200 includes a combustion-supporting gas supply box 210 and a flammable gas supply box 260. The combustion-supporting gas supply box 210 includes a combustion-supporting gas line 211 and a first nitrogen purge part 220. The combustion-supporting gas line 211 has distal and proximal ends connected to the gas supply pipe 83 and a combustion-supporting gas supply source 212, respectively. A mass flow controller 213 and a supply valve 214 are interposed in the combustion-supporting gas line 211. In the first preferred embodiment, the combustion-supporting gas supply source 212 supplies oxygen (O 2) into the combustion-supporting gas line 211 as a combustion-supporting gas. The supply valve opens and closes the flow path of the combustion-supporting gas line 211. When the supply valve 214 is opened, oxygen is supplied from the combustion-supporting gas supply source 212 into the chamber 6 through the combustion-supporting gas line 211. The flow rate of oxygen flowing through the combustion-supporting gas line 211 is regulated by the mass flow controller 213.

The first nitrogen purge part 220 includes a nitrogen line 221, a nitrogen supply source 222, a mass flow controller 223, and a supply valve 224. The nitrogen line 221 has a distal end connected to the combustion-supporting gas line 211 on the downstream side (closer to the chamber 6) of the supply valve 214. The nitrogen line 221 has a proximal end connected to the nitrogen supply source 222. The mass flow controller and the supply valve 224 are interposed in the nitrogen line 221. The nitrogen supply source 222 supplies nitrogen (N 2) into the nitrogen line 221. The supply valve opens and closes the flow path of the nitrogen line 221. When the supply valve 224 is opened, nitrogen is fed from the first nitrogen purge part 220 into the combustion-supporting gas line 211. The flow rate of nitrogen flowing through the nitrogen line 221 is regulated by the mass flow controller 223.

On the other hand, the flammable gas supply box 260 includes a flammable gas line 261 and a second nitrogen purge part 270. The flammable gas line 261 has distal and proximal ends connected to the gas supply pipe 83 and a flammable gas supply source 262, respectively. A mass flow controller 263 and a supply valve 264 are interposed in the flammable gas line 261. In the first preferred embodiment, the flammable gas supply source 262 supplies ammonia (NH 3) as a flammable gas into the flammable gas line 261. The supply valve 264 opens and closes the flow path of the flammable gas line 261. When the supply valve 264 is opened, ammonia is supplied from the flammable gas supply source 262 into the chamber 6 through the flammable gas line 261. The flow rate of ammonia flowing through the flammable gas line 261 is regulated by the mass flow controller 263.

The second nitrogen purge part 270 includes a nitrogen line 271, a nitrogen supply source 272, a mass flow controller 273, and a supply valve 274. The nitrogen line 271 has a distal end connected to the flammable gas line 261 on the downstream side of the supply valve 264. The nitrogen line 271 has a proximal end connected to the nitrogen supply source 272. The mass flow controller 273 and the supply valve 274 are interposed in the nitrogen line 271. The nitrogen supply source 272 supplies nitrogen (N 2) into the nitrogen line 271. The supply valve 274 opens and closes the flow path of the nitrogen line 271. When the supply valve 274 is opened, nitrogen is fed from the second nitrogen purge part 270 into the flammable gas line 261. The flow rate of nitrogen flowing through the nitrogen line 271 is regulated by the mass flow controller 273.

The exhaust part 300 includes a normal pressure exhaust line 310 and an evacuation line 320. The normal pressure exhaust line 310 has a distal end connected to the gas exhaust pipe 88. A normal pressure exhaust valve 311 is provided in the normal pressure exhaust line 310. The normal pressure exhaust valve 311 opens and closes the flow path of the normal pressure exhaust line 310. When the heat treatment space 65 of the chamber 6 is under a normal pressure (atmospheric pressure), opening the normal pressure exhaust valve 311 exhausts gas from the chamber 6 through the normal pressure exhaust line 310.

The evacuation line 320 has a distal end connected to the gas exhaust pipe 88. A pressure gauge 321, an evacuation valve 322, and a vacuum pump 323 are provided in the evacuation line 320. The pressure gauge 321 measures the pressure in the evacuation line 320. The pressure in the evacuation line 320 at a position where the pressure gauge 321 is provided is equal to the pressure in the chamber 6; therefore, the pressure measured by the pressure gauge 321 is the same as the pressure in the chamber 6. The evacuation valve 322 opens and closes the flow path of the evacuation line 320. Opening the evacuation valve 322 with the vacuum pump 323 kept in operation evacuates gas from the chamber 6 through the evacuation line 320 to reduce the pressure in the chamber 6 to less than atmospheric pressure.

Referring again to FIG. 1, the controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like thereon. The CPU in the controller 3 executes a predetermined processing program, whereby the processes in the heat treatment apparatus proceed.

The heat treatment apparatus 1 further includes, in addition to the aforementioned components, various cooling structures to prevent an excessive temperature rise in the halogen heating part 4, the flash heating part 5, and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Figure 9:
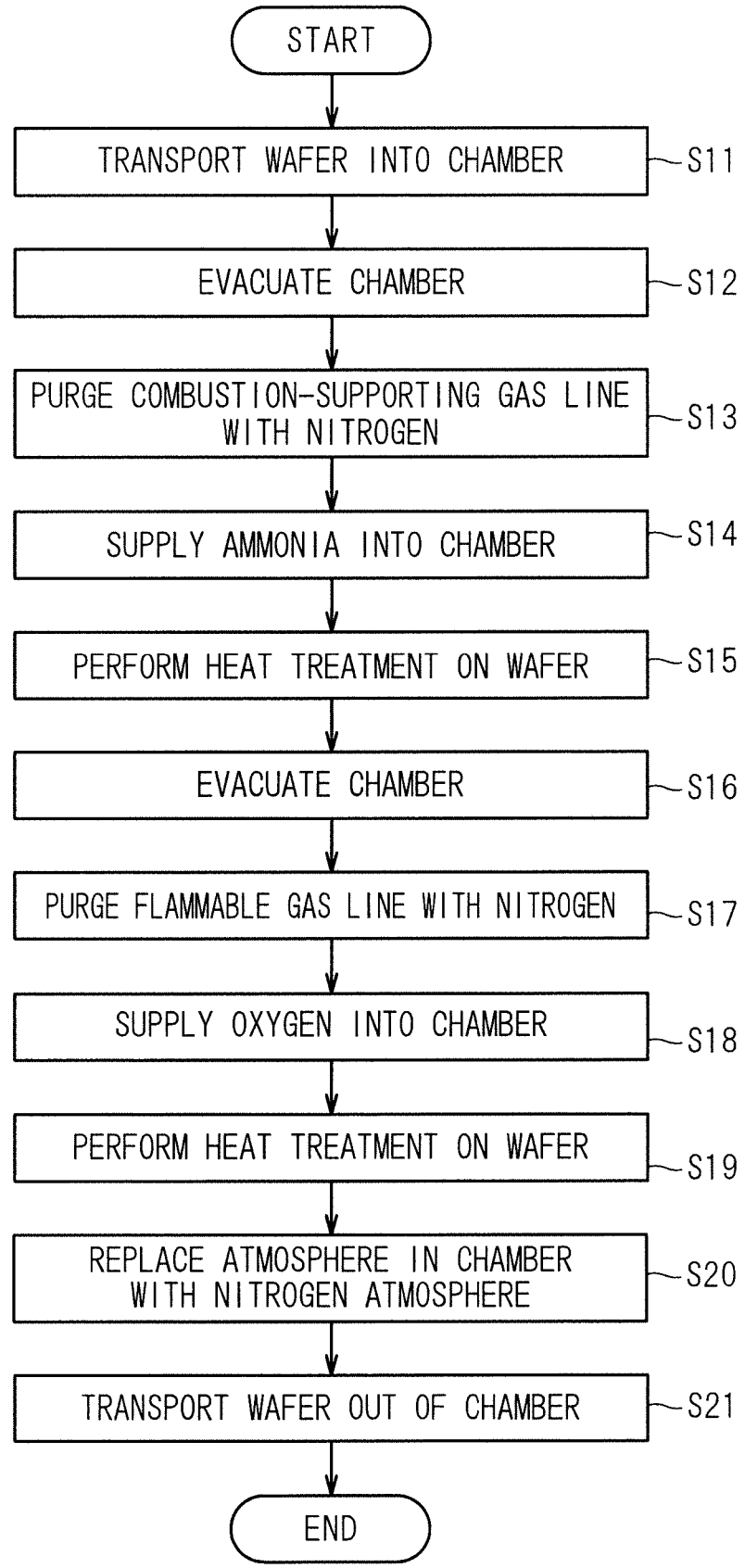
FIG. 9 is a flow diagram showing a procedure for a heat treatment method of a first preferred embodiment.

Next, a heat treatment method according to the present invention will be described. FIG. 9 is a flow diagram showing a procedure for the heat treatment method of the first preferred embodiment. A semiconductor wafer to be treated in the present preferred embodiment is a silicon (Si) semiconductor wafer W.

First, the semiconductor wafer W is transported into the chamber 6 of the heat treatment apparatus 1 (Step S11). Specifically, the gate valve 185 is opened to open the transport opening 66. A transport robot outside the heat treatment apparatus 1 transports the semiconductor wafer W through the transport opening 66 into the heat treatment space of the chamber 6. At this time, nitrogen gas may be supplied into the chamber 6 by opening the supply valve 224 or the supply valve 274 and caused to flow outwardly through the transport opening 66, thereby minimizing an outside atmosphere carried into the heat treatment space 65 as the semiconductor wafer W is transported into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 with a front surface of the semiconductor wafer W on which a pattern is formed is assumed as the upper surface. A predetermined distance is defined between a back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

Figure 10:
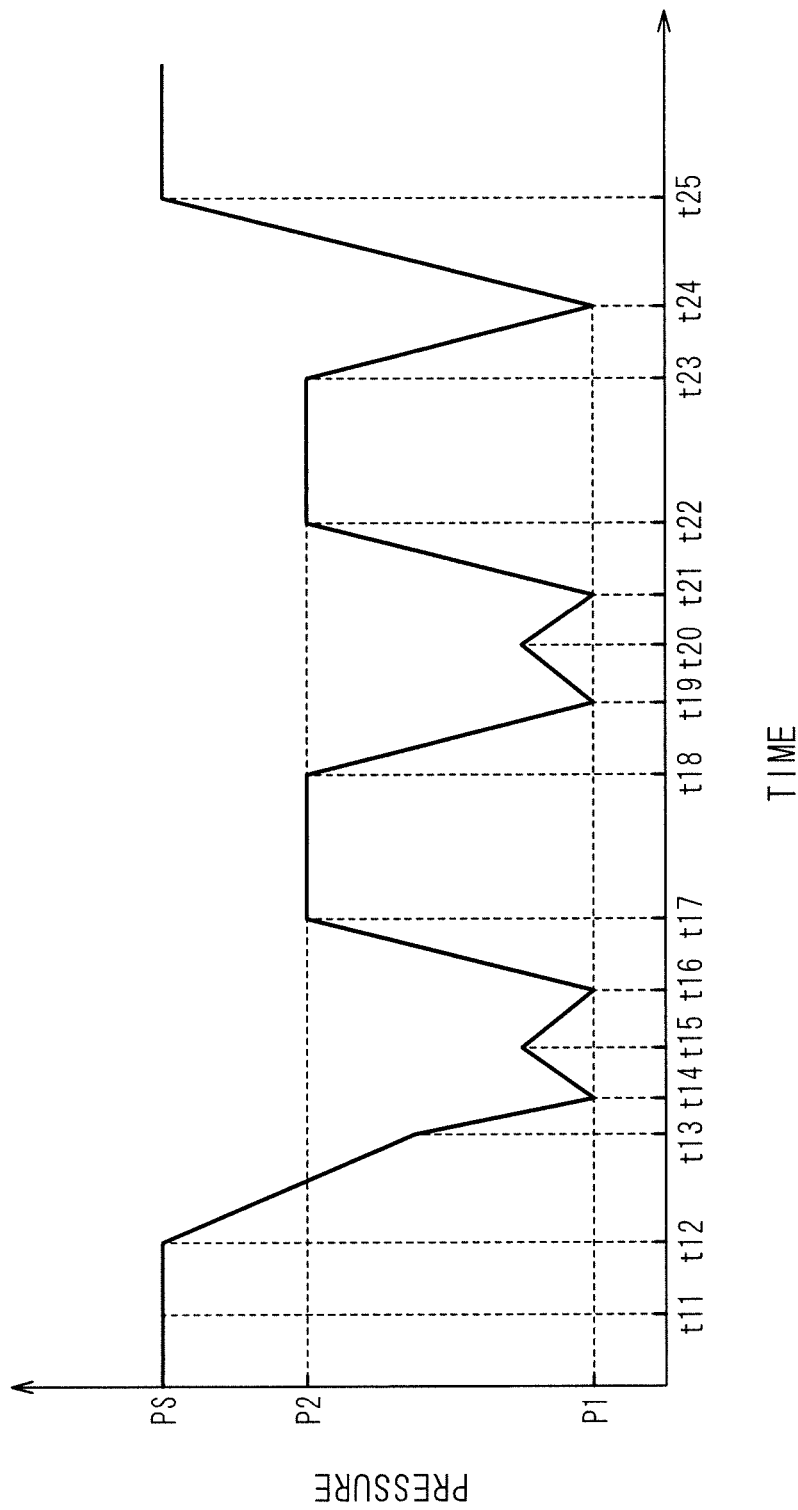
FIG. 10 is a diagram showing changes in pressure in a chamber of the first preferred embodiment.

FIG. 10 is a diagram showing changes in pressure in the chamber 6 of the first preferred embodiment. The semiconductor wafer W is transported into the chamber 6, and the transport opening 66 is closed by the gate valve 185 at time t11, so that the heat treatment space 65 becomes an enclosed space. At this time, the pressure in the chamber is equal to a normal pressure (atmospheric pressure) PS. Then, at time t12, evacuation of the chamber 6 is started (Step S12). At this time, opening the evacuation valve 322 with the vacuum pump 323 kept in operation without supplying gas from the gas supply part 200 evacuates gas from the chamber 6 through the evacuation line 320. The normal pressure exhaust valve 311 is closed. When the gas is evacuated from the chamber 6, the pressure in the chamber 6 is reduced to less than atmospheric pressure.

The pressure in the chamber 6 is reduced over a period from time t12 to time t14. At time t13 corresponding to the midpoint of the pressure reduction, an exhaust rate is changed. Specifically, the gas is exhausted from the chamber 6 at a relatively low exhaust rate from time t12 to time t13 and is exhausted at a relatively high exhaust rate from time t13 to time t14. Such a change in exhaust rate may be made in a manner where, for example, a plurality of bypass lines are provided in the evacuation line 320, the gas is exhausted through a single line from time t12 to time t13 and is exhausted through the plurality of bypass lines from time t13 to time t14. Exhausting the gas at a relatively low exhaust rate in an initial stage of evacuation makes it possible to prevent a sudden air flow from being generated in the chamber 6 and to prevent particles and the like from swirling up.

Subsequently, a nitrogen purge on the combustion-supporting gas line 211 is started at time t14 when the pressure in the chamber 6 reaches a pressure P1 (Step S13). At this time, the supply valve 224 is opened to feed nitrogen from the first nitrogen purge part 220 into the combustion-supporting gas line 211 to cause oxygen remaining in the combustion-supporting gas line 211 to flow out into the chamber 6. The evacuation of the chamber 6 in step S12 exhausts residual gas from the chamber 6, but some oxygen may remain in the combustion-supporting gas line 211 that is significantly smaller in diameter than the chamber 6. The nitrogen purge in step S13 causes such oxygen remaining in the combustion-supporting gas line 211 to flow out into the chamber 6 and then to be exhausted through the evacuation line 320. This causes the oxygen remaining in the chamber 6 and the combustion-supporting gas line 211 to be almost completely exhausted.

The nitrogen purge in step S13 causes nitrogen and oxygen to flow into the chamber 6, thereby slightly increasing the pressure in the chamber 6 from the pressure P1. Then, the nitrogen purge is completed at time t15. At time t15, the supply valve 224 is closed to reduce the pressure in the chamber 6 again. Then, at time t16, the pressure in the chamber 6 reaches the pressure P1. The pressure P1 is in a range of 0.05 kPa to 0.5 kPa, and it can be said that the interior of the chamber 6 reduced in pressure to the pressure P1 is substantially in a vacuum state.

Next, at time t16, the supply of ammonia, which is a flammable gas, into the chamber 6 is started (Step S14). Specifically, the supply valve 264 is opened at time t16 to supply ammonia into the chamber 6 through the flammable gas line 261. Since oxygen is almost completely exhausted from the heat treatment apparatus 1 including the chamber 6 by the evacuation in step S12 and the nitrogen purge in step S13, ammonia, which is a flammable gas, and oxygen, which is a combustion-supporting gas, are reliably prevented from being mixed with each other in the heat treatment apparatus 1.

The supply of ammonia into the chamber 6 forms an ammonia-containing atmosphere in the heat treatment space 65 of the chamber 6 and increases the pressure in the chamber 6. When the pressure in the chamber 6 reaches a pressure P2 at time t17, the ammonia supply flow rate through the flammable gas line 261 is made almost equal to the exhaust flow rate through the evacuation line 320, so that the pressure in the chamber is maintained at the pressure P2. The pressure P2 is higher than the aforementioned pressure P1 and less than atmospheric pressure. The pressure in the chamber 6 is maintained at the pressure P2 from time t17 to time t18.

Over a period from time t17 to time t18 during which the ammonia-containing atmosphere is formed in the chamber 6, and the pressure in the chamber 6 is maintained at the pressure P2, the semiconductor wafer W is subjected to heating treatment (Step S15). Specifically, the halogen lamps HL in the halogen heating part 4 turn on to preheat the semiconductor wafer W to a preheating temperature T1. Halogen light emitted from the halogen lamps HL is transmitted through the lower chamber window 64 and the susceptor both made of quartz, and impinges upon the back surface of the semiconductor wafer W. By receiving light irradiation from the halogen lamps HL, the semiconductor wafer W is preheated, so that the temperature of the semiconductor wafer W increases.

The temperature of the semiconductor wafer W is measured with the lower radiation thermometer 20 when the halogen lamps HL perform the heating. Specifically, the lower radiation thermometer 20 receives infrared radiation emitted from the lower surface of the semiconductor wafer W held by the susceptor 74 through the opening 78 and passing through the transparent window 21 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches the predetermined preheating temperature T1 or not. Specifically, the controller 3 effects feedback control of the output from the halogen lamps HL so that the temperature of the semiconductor wafer W is equal to the preheating temperature T1, based on the value measured with the lower radiation thermometer 20.

After the temperature of the semiconductor wafer W reaches the preheating temperature T1, the front surface of the semiconductor wafer W is irradiated with flashes of light from the flash lamps FL in the flash heating part 5. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the irradiation with a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. Then, the temperature of the front surface of the semiconductor wafer W flash-heated by the irradiation with flashes of light from the flash lamps FL is increased momentarily to a treatment temperature T2 and then decreases rapidly. Preheating and flash heating the semiconductor wafer W in the ammonia atmosphere forms a thin film of silicon nitride ($Si_3N_4$) on the front surface of the semiconductor wafer W.

After the preheating by the halogen lamps HL and the flash heating by the flash lamps FL are finished, the evacuation of the chamber 6 is resumed at time t18 (Step S16). Specifically, at time t18, the supply valve 264 is closed to stop the supply of ammonia into the chamber 6, and ammonia is exhausted from the chamber 6 through the evacuation line 320, thereby evacuating the chamber 6.

Subsequently, a nitrogen purge on the flammable gas line 261 is started at time t19 when the pressure in the chamber 6 reaches the pressure P1 (Step S17). At this time, the supply valve 274 is opened to feed nitrogen from the second nitrogen purge part 270 into the flammable gas line 261 to cause ammonia remaining in the flammable gas line to flow out into the chamber 6. The evacuation of the chamber 6 in step S16 exhausts ammonia remaining in the chamber 6, but some ammonia may remain in the flammable gas line 261 that is significantly smaller in diameter than the chamber 6. The nitrogen purge in step S17 causes such ammonia remaining in the flammable gas line 261 to flow out into the chamber 6 and then to be exhausted through the evacuation line 320. This causes the ammonia remaining in the chamber 6 and the flammable gas line 261 to be almost completely exhausted.

The nitrogen purge in step S17 causes nitrogen and ammonia to flow into the chamber 6, thereby slightly increasing the pressure in the chamber 6 from the pressure P1. Then, the nitrogen purge is completed at time t20. At time t20, the supply valve 274 is closed to reduce the pressure in the chamber 6 again. Then, at time t21, the pressure in the chamber 6 reaches the pressure P1 again.

Next, at time t21, the supply of oxygen, which is a combustion-supporting gas, into the chamber 6 is started (Step S18). Specifically, the supply valve 214 is opened at time t21 to supply oxygen into the chamber 6 through the combustion-supporting gas line 211. Since ammonia is almost completely exhausted from the heat treatment apparatus including the chamber 6 by the evacuation in step S16 and the nitrogen purge in step S17, ammonia, which is a flammable gas, and oxygen, which is a combustion-supporting gas, are reliably prevented from being mixed with each other in the heat treatment apparatus 1.

The supply of oxygen into the chamber 6 forms an oxygen-containing atmosphere in the heat treatment space 65 of the chamber 6 and increases the pressure in the chamber 6. When the pressure in the chamber 6 reaches the pressure P2 at time t22, the oxygen supply flow rate through the combustion-supporting gas line 211 is made almost equal to the exhaust flow rate through the evacuation line 320, so that the pressure in the chamber 6 is maintained at the pressure P2.

Over a period from time t22 to time t23 during which the oxygen-containing atmosphere is formed in the chamber 6, and the pressure in the chamber 6 is maintained at the pressure P2, the semiconductor wafer W is subjected to heating treatment (Step S19). The heating treatment on the semiconductor wafer W corresponds to the preheating by the halogen lamps HL and the subsequent flash heating by the flash lamps FL, as in the aforementioned ammonia atmosphere. Preheating and flash heating the semiconductor wafer W in the oxygen atmosphere forms a thin film of silicon dioxide ($SiO_2$) on a base of a silicon nitride film formed in advance.

After the preheating by the halogen lamps HL and the flash heating by the flash lamps FL are finished, the oxygen atmosphere in the chamber 6 is replaced with a nitrogen atmosphere (Step S20). Specifically, at time t23, the supply valve 214 is closed to stop the supply of oxygen into the chamber 6, and oxygen is exhausted from the chamber 6 through the evacuation line 320, thereby evacuating the chamber 6. Then, at time t24 when the pressure in the chamber 6 reaches the pressure P1, the evacuation valve is closed, and the supply valve 224 and/or the supply valve 274 are opened to supply nitrogen into the chamber 6.

The supply of nitrogen into the chamber 6 without exhausting gas from the chamber 6 rapidly increases the pressure in the chamber 6. Then, after the pressure in the chamber 6 is returned to the normal pressure PS at time t25, the normal pressure exhaust valve 311 is opened to exhaust the nitrogen supplied into the chamber 6 through the normal pressure exhaust line 310.

After the atmosphere in the chamber 6 is replaced with the nitrogen atmosphere and the pressure is returned to the normal pressure PS, the semiconductor wafer W thus treated is transported out of the chamber 6 (Step S21). Specifically, the pair of transfer arms 11 of the transfer mechanism 10 is moved horizontally from the retracted position to the transfer operation position again and is then moved upwardly, whereby the lift pins 12 protrude from the upper surface of the susceptor 74 to receive the treated semiconductor wafer W. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heat treatment of the semiconductor wafer W.

In the heat treatment apparatus 1 of the first preferred embodiment, a process of supplying ammonia, which is a flammable gas, into the chamber 6 and then supplying oxygen, which is a combustion-supporting gas, into the chamber 6 is performed. At this time, in the first preferred embodiment, before supplying ammonia, which is a flammable gas, into the chamber 6, the chamber 6 is evacuated to exhaust residual gas from the chamber 6, and then nitrogen is fed into the combustion-supporting gas line 211 to cause oxygen remaining in the combustion-supporting gas line 211 to flow out. As a result, the oxygen remaining in the chamber 6 and the combustion-supporting gas line 211 is almost completely exhausted before ammonia is supplied into the chamber 6, thereby reliably preventing, even when ammonia is supplied, ammonia, which is a flammable gas, and oxygen, which is a combustion-supporting gas, from being mixed with each other.

In the first preferred embodiment, after supplying ammonia, which is a flammable gas, into the chamber 6, the chamber 6 is evacuated to exhaust the ammonia from the chamber 6, and then nitrogen is fed into the flammable gas line 261 to cause ammonia remaining in the flammable gas line 261 to flow out. As a result, the ammonia remaining in the chamber 6 and the flammable gas line 261 is almost completely exhausted before oxygen is supplied into the chamber 6, thereby reliably preventing, even when oxygen is supplied, the ammonia, which is a flammable gas, and the oxygen, which is a combustion-supporting gas, from being mixed with each other.

On the downstream side of the exhaust part 300 that exhausts gas from the chamber 6, when the evacuation in step S12 and the nitrogen purge in step S13 are performed, oxygen is exhausted, and then nitrogen is exhausted. Next, when the evacuation in step S16 and the nitrogen purge in step S17 are performed, ammonia is exhausted, and then nitrogen is exhausted. Then, when the replacement process in step S20 is performed, oxygen is exhausted, and then nitrogen is exhausted. That is, oxygen or ammonia and nitrogen are alternately exhausted on the downstream side of the exhaust part 300. For example, after oxygen is exhausted from the downstream side of the exhaust part 300, nitrogen is exhausted before ammonia is exhausted at all times. After ammonia is exhausted from the downstream side of the exhaust part 300, nitrogen is exhausted before oxygen is exhausted at all times. Therefore, it is possible to prevent ammonia, which is a flammable gas, and oxygen, which is a combustion-supporting gas, from being mixed with each other even on the downstream side of the exhaust part 300, and safety is ensured accordingly.

Second Preferred Embodiment

Next, the second preferred embodiment of the present invention will be described. The second preferred embodiment is the same in the configuration of the heat treatment apparatus 1 as the first preferred embodiment. In the first preferred embodiment, ammonia is supplied before oxygen is supplied, but in the second preferred embodiment, oxygen is supplied into the chamber 6 before ammonia is supplied.

Figure 11:
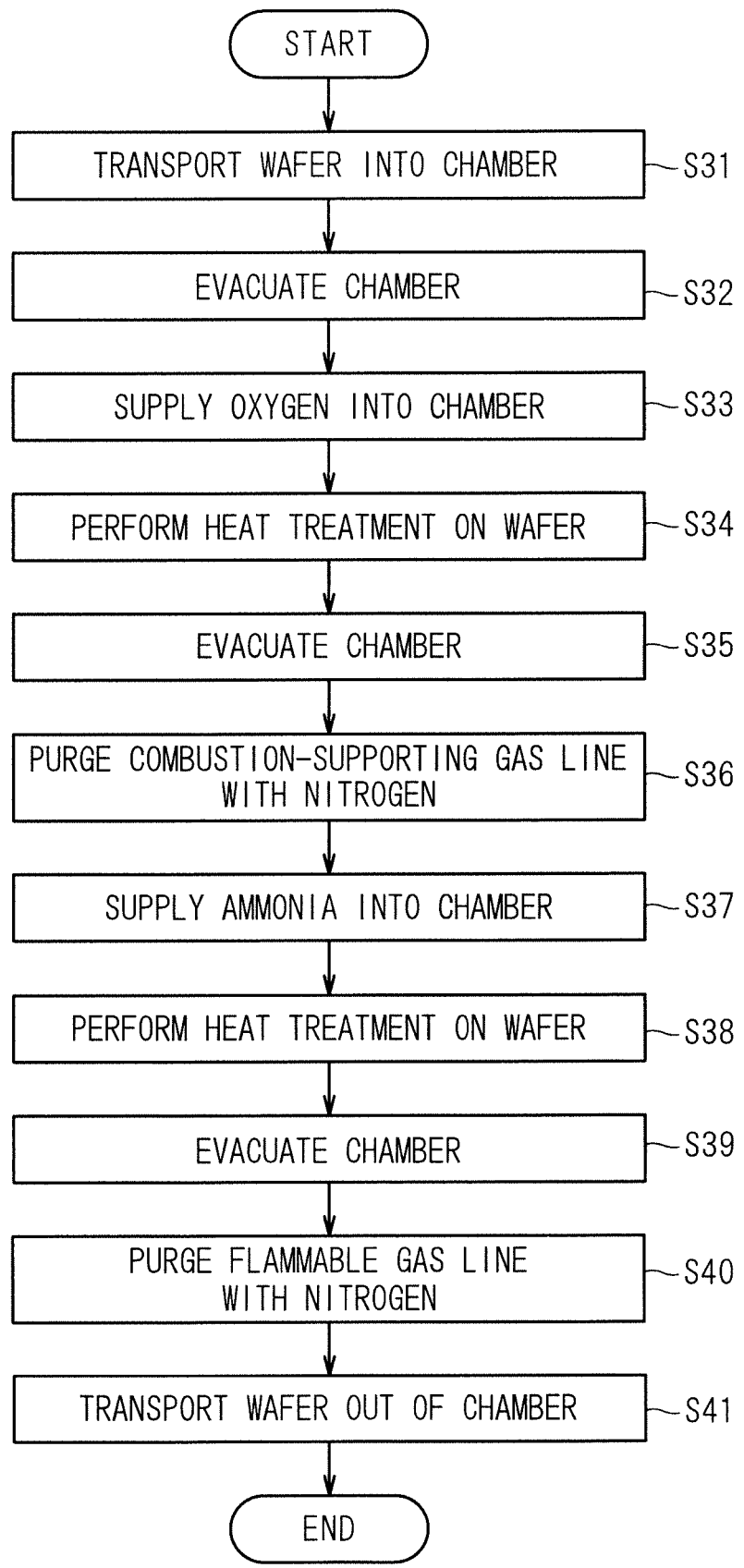
FIG. 11 is a flow diagram showing a procedure for a heat treatment method of a second preferred embodiment.

FIG. 11 is a flow diagram showing a procedure for a heat treatment method of the second preferred embodiment. FIG. 12 is a diagram showing changes in pressure in the chamber 6 of the second preferred embodiment. First, the semiconductor wafer W is transported into the chamber 6 of the heat treatment apparatus 1 (Step S31). This procedure for transporting the semiconductor wafer W is the same as the procedure of the first preferred embodiment.

The semiconductor wafer W is transported into the chamber 6, and the transport opening 66 is closed by the gate valve 185 at time t31, so that the heat treatment space 65 becomes an enclosed space. At this time, the pressure in the chamber 6 is equal to a normal pressure (atmospheric pressure) PS. Then, at time t32, evacuation of the chamber 6 is started (Step S32). At this time, opening the evacuation valve 322 with the vacuum pump 323 kept in operation without supplying gas from the gas supply part 200 evacuates gas from the chamber 6 through the evacuation line 320. The normal pressure exhaust valve 311 is closed. When the gas is evacuated from the chamber 6, the pressure in the chamber 6 is reduced to less than atmospheric pressure.

The pressure in the chamber 6 is reduced over a period from time t32 to time t34. At time t33 corresponding to the midpoint of the pressure reduction, an exhaust rate is changed. Specifically, the gas is exhausted from the chamber 6 at a relatively low exhaust rate from time t32 to time t33 and is exhausted at a relatively high exhaust rate from time t33 to time t34. Such a change in the exhaust rate is made in the same manner as in the first preferred embodiment.

Next, at time t34 when the pressure in the chamber 6 reaches the pressure P1, the supply of oxygen, which is a combustion-supporting gas, into the chamber 6 is started (Step S33). Specifically, the supply valve 214 is opened at time t34 to supply oxygen into the chamber 6 through the combustion-supporting gas line 211. The supply of oxygen into the chamber 6 forms an oxygen-containing atmosphere in the heat treatment space 65 of the chamber 6 and increases the pressure in the chamber 6. When the pressure in the chamber 6 reaches the pressure P2 at time t35, the oxygen supply flow rate through the combustion-supporting gas line 211 is made almost equal to the exhaust flow rate through the evacuation line 320, so that the pressure in the chamber 6 is maintained at the pressure P2. As in the first preferred embodiment, the pressure P1 is in a range of 0.05 kPa to 0.5 kPa, and the pressure P2 is higher than the pressure P1 and lower than atmospheric pressure.

Over a period from time t35 to time t36 during which the oxygen-containing atmosphere is formed in the chamber 6, and the pressure in the chamber 6 is maintained at the pressure P2, the semiconductor wafer W is subjected to heating treatment (Step S34). As in the first preferred embodiment, the heating treatment on the semiconductor wafer W corresponds to preheating by the halogen lamps HL and subsequent flash heating by the flash lamps FL. Preheating and flash heating the semiconductor wafer W in the oxygen atmosphere forms a thin film of silicon dioxide ($SiO_2$) on the front surface of the semiconductor wafer W.

After the preheating by the halogen lamps HL and the flash heating by the flash lamps FL are finished, the evacuation of the chamber 6 is resumed at time t36 (Step S35). Specifically, at time t36, the supply valve 214 is closed to stop the supply of oxygen into the chamber 6, and oxygen is exhausted from the chamber 6 through the evacuation line 320, thereby evacuating the chamber 6.

Subsequently, nitrogen purge on the combustion-supporting gas line 211 is started at time t37 when the pressure in the chamber 6 reaches the pressure P1 (Step S36). At this time, the supply valve 224 is opened to feed nitrogen from the first nitrogen purge part 220 into the combustion-supporting gas line 211 to cause oxygen remaining in the combustion-supporting gas line 211 to flow out into the chamber 6. The evacuation of the chamber 6 in step S35 exhausts oxygen from the chamber 6, but some oxygen may remain in the combustion-supporting gas line 211 that is significantly smaller in diameter than the chamber 6. The nitrogen purge in step S36 causes such oxygen remaining in the combustion-supporting gas line 211 to flow out into the chamber 6 and then to be exhausted through the evacuation line 320. This causes the oxygen remaining in the chamber 6 and the combustion-supporting gas line 211 to be almost completely exhausted.

The nitrogen purge in step S36 causes nitrogen and oxygen to flow into the chamber 6, thereby slightly increasing the pressure in the chamber 6 from the pressure P1.

Then, the nitrogen purge is completed at time t38. At time t38, the supply valve 224 is closed to reduce the pressure in the chamber 6 again. Then, at time t39, the pressure in the chamber 6 reaches the pressure P1.

Next, at time t39, the supply of ammonia, which is a flammable gas, into the chamber 6 is started (Step S37). Specifically, the supply valve 264 is opened at time t39 to supply ammonia into the chamber 6 through the flammable gas line 261. Since oxygen is almost completely exhausted from the heat treatment apparatus 1 including the chamber 6 by the evacuation in step S35 and the nitrogen purge in step S36, ammonia, which is a flammable gas, and oxygen, which is a combustion-supporting gas, are reliably prevented from being mixed with each other in the heat treatment apparatus 1.

The supply of ammonia into the chamber 6 forms an ammonia-containing atmosphere in the heat treatment space 65 of the chamber 6 and increases the pressure in the chamber 6. When the pressure in the chamber 6 reaches the pressure P2 at time t40, the ammonia supply flow rate through the flammable gas line 261 is made almost equal to the exhaust flow rate through the evacuation line 320, so that the pressure in the chamber is maintained at the pressure P2. The pressure in the chamber 6 is maintained at the pressure P2 from time t40 to time t41.

Over a period from time t40 to time t41 during which the ammonia-containing atmosphere is formed in the chamber 6, and the pressure in the chamber 6 is maintained at the pressure P2, the semiconductor wafer W is subjected to heating treatment (Step S38). As described above, the heating treatment on the semiconductor wafer W corresponds to preheating by the halogen lamps HL and subsequent flash heating by the flash lamps FL. Preheating and flash heating the semiconductor wafer W in the ammonia atmosphere nitrides a thin film of silicon dioxide formed in advance to form a film of silicon oxynitride (SiON).

After the preheating by the halogen lamps HL and the flash heating by the flash lamps FL are finished, the evacuation of the chamber 6 is resumed at time t41 (Step S39). Specifically, at time t41, the supply valve 264 is closed to stop the supply of ammonia into the chamber 6, and ammonia is exhausted from the chamber 6 through the evacuation line 320, thereby evacuating the chamber 6.

Subsequently, nitrogen purge on the flammable gas line 261 is started at time t42 when the pressure in the chamber 6 reaches the pressure P1 (Step S40). At this time, the supply valve 274 is opened to feed nitrogen from the second nitrogen purge part 270 into the flammable gas line 261 to cause ammonia remaining in the flammable gas line to flow out into the chamber 6. The evacuation of the chamber 6 in step S39 exhausts ammonia remaining in the chamber 6, but some ammonia may remain in the flammable gas line 261 that is significantly smaller in diameter than the chamber 6. The nitrogen purge in step S40 causes such ammonia remaining in the flammable gas line 261 to flow out into the chamber 6 and then to be exhausted through the evacuation line 320. This causes the ammonia remaining in the chamber 6 and the flammable gas line 261 to be almost completely exhausted.

The nitrogen purge in step S40 causes nitrogen and ammonia to flow into the chamber 6, thereby slightly increasing the pressure in the chamber 6 from the pressure P1. Then, the nitrogen purge is completed at time t43. At time t43, the supply valve 274 is closed to reduce the pressure in the chamber 6 again. Then, at time t44, the pressure in the chamber 6 reaches the pressure P1 again.

Subsequently, at time t44 when the pressure in the chamber 6 reaches the pressure P1, the evacuation valve 322 is closed, and the supply valve 224 and/or the supply valve 274 are opened to supply nitrogen into the chamber 6. The supply of nitrogen into the chamber 6 without exhausting gas from the chamber 6 rapidly increases the pressure in the chamber 6. Then, after the pressure in the chamber 6 is returned to the normal pressure PS at time t45, the normal pressure exhaust valve 311 is opened to exhaust the nitrogen supplied into the chamber 6 through the normal pressure exhaust line 310.

After the atmosphere in the chamber 6 is replaced with the nitrogen atmosphere and the pressure is returned to the normal pressure PS, the semiconductor wafer W thus treated is transported out of the chamber 6 (Step S41). This procedure for transporting the semiconductor wafer W is also the same as the procedure of the first preferred embodiment. When the semiconductor wafer W is transported out of the chamber 6, the heat treatment on the semiconductor wafer W in the heat treatment apparatus 1 is completed.

In the heat treatment apparatus 1 of the second preferred embodiment, a process of supplying oxygen, which is a combustion-supporting gas, into the chamber 6 and then supplying ammonia, which is a flammable gas, into the chamber 6 is performed. At this time, in the second preferred embodiment, before supplying ammonia, which is a flammable gas, into the chamber 6, the chamber 6 is evacuated to exhaust residual gas from the chamber 6, and then nitrogen is fed into the combustion-supporting gas line 211 to cause oxygen remaining in the combustion-supporting gas line 211 to flow out. As a result, the oxygen remaining in the chamber 6 and the combustion-supporting gas line is almost completely exhausted before ammonia is supplied into the chamber 6, thereby reliably preventing, even when ammonia is supplied, ammonia, which is a flammable gas, and oxygen, which is a combustion-supporting gas, from being mixed with each other.

In the second preferred embodiment, after supplying ammonia, which is a flammable gas, into the chamber 6, the chamber 6 is evacuated to exhaust the ammonia from the chamber 6, and then nitrogen is fed into the flammable gas line 261 to cause ammonia remaining in the flammable gas line 261 to flow out. As a result, the ammonia remaining in the chamber 6 and the flammable gas line 261 is almost completely exhausted, thereby reliably preventing, even when oxygen is supplied in the next process, the ammonia, which is a flammable gas, and the oxygen, which is a combustion-supporting gas, from being mixed with each other.

On the downstream side of the exhaust part 300 that exhausts gas from the chamber 6, when the evacuation in step S35 and the nitrogen purge in step S36 are performed, oxygen is exhausted, and then nitrogen is exhausted. Next, when the evacuation in step S39 and the nitrogen purge in step S40 are performed, ammonia is exhausted, and then nitrogen is exhausted. That is, oxygen or ammonia and nitrogen are alternately exhausted on the downstream side of the exhaust part 300. Therefore, as in the first preferred embodiment, it is possible to prevent ammonia, which is a flammable gas, and oxygen, which is a combustion-supporting gas, from being mixed with each other even on the downstream side of the exhaust part 300, and safety is ensured accordingly.

Third Preferred Embodiment

Next, a third preferred embodiment of the present invention will be described. The third preferred embodiment is the same in the configuration of the heat treatment apparatus 1 as the first preferred embodiment. The third preferred embodiment is almost the same in the procedure for the heat treatment method as the first preferred embodiment (FIG. 9). In the first preferred embodiment, an oxygen atmosphere under the pressure P2 lower than atmospheric pressure is formed, but in the third preferred embodiment, an oxygen atmosphere under the normal pressure equal to atmospheric pressure is formed.

FIG. 13 is a diagram showing changes in pressure in the chamber 6 of the third preferred embodiment. The processing content of the third preferred embodiment from time t51 to time t61 is exactly the same as the processing content of the first preferred embodiment from time t11 to time t21. Also in the third preferred embodiment, the supply of oxygen, which is a combustion-supporting gas, into the chamber 6 is started at time t61. Specifically, at time t61, the evacuation valve 322 is closed, and the supply valve 214 is opened to supply oxygen into the chamber 6 through the combustion-supporting gas line 211.

The supply of oxygen into the chamber 6 forms an oxygen-containing atmosphere in the heat treatment space 65 of the chamber 6 and increases the pressure in the chamber 6. In the third preferred embodiment, the pressure in the chamber 6 is returned to the normal pressure PS at time t62. Then, after the pressure in the chamber 6 is returned to the normal pressure PS at time t62, the normal pressure exhaust valve 311 is opened.

In the third preferred embodiment, the semiconductor wafer W is subjected to heating treatment in the oxygen atmosphere under the normal pressure PS. As in the first preferred embodiment, the heating treatment on the semiconductor wafer W corresponds to preheating by the halogen lamps HL and subsequent flash heating by the flash lamps FL.

After the preheating by the halogen lamps HL and the flash heating by the flash lamps FL are finished, the oxygen atmosphere in the chamber 6 is replaced with a nitrogen atmosphere. In the third preferred embodiment, nitrogen is supplied, without evacuating the chamber 6, to replace the oxygen atmosphere with the nitrogen atmosphere while maintaining the normal pressure PS. Then, after the oxygen atmosphere in the chamber 6 is replaced with the nitrogen atmosphere, the semiconductor wafer W thus treated is transported out of the chamber 6.

The third preferred embodiment can also bring about the same effect as in the first preferred embodiment. Therefore, it is possible to prevent ammonia, which is a flammable gas, and oxygen, which is a combustion-supporting gas, from being mixed with each other, not only in the heat treatment apparatus 1, but also on the downstream side of the exhaust part 300.

Fourth Preferred Embodiment

Next, a fourth preferred embodiment of the present invention will be described. The fourth preferred embodiment is the same in the configuration of the heat treatment apparatus 1 as the first preferred embodiment. The fourth preferred embodiment is almost the same in the procedure for the heat treatment method as the second preferred embodiment (FIG. 11). In the second preferred embodiment, an oxygen atmosphere under the pressure P2 lower than atmospheric pressure is formed, but in the fourth preferred embodiment, an oxygen atmosphere under the normal pressure equal to atmospheric pressure is formed.

FIG. 14 is a diagram showing changes in pressure in the chamber 6 of the fourth preferred embodiment. In the fourth preferred embodiment, after the transport opening is closed by the gate valve 185 at time t71, oxygen is supplied, without evacuating the chamber 6, into the chamber 6 to form an oxygen atmosphere. Specifically, the supply valve 214 is opened with the normal pressure exhaust valve 311 open to supply oxygen into the chamber 6 through the combustion-supporting gas line 211, thereby forming an oxygen atmosphere under the normal pressure PS in the chamber 6.

In the fourth preferred embodiment, after the oxygen atmosphere is formed in the chamber 6, the semiconductor wafer W is subjected to heating treatment in the oxygen atmosphere under the normal pressure PS. As in the first preferred embodiment, the heating treatment on the semiconductor wafer W corresponds to preheating by the halogen lamps HL and subsequent flash heating by the flash lamps FL.

After the preheating by the halogen lamps HL and the flash heating by the flash lamps FL are finished, the evacuation of the chamber 6 is started at time t72 to reduce the pressure in the chamber 6. The pressure in the chamber 6 is reduced over a period from time t72 to time t74. At time t73 corresponding to the midpoint of the pressure reduction, an exhaust rate is changed. Specifically, the gas is exhausted from the chamber 6 at a relatively low exhaust rate from time t72 to time t73 and is exhausted at a relatively high exhaust rate from time t73 to time t74. Such a change in the exhaust rate is made in the same manner as in the first preferred embodiment.

The processing content of the fourth preferred embodiment from time t74 when the pressure in the chamber 6 reaches the pressure P1 to time t82 is exactly the same as the processing content of the second preferred embodiment from time t37 to time t45.

The fourth preferred embodiment can also bring about the same effect as in the first preferred embodiment. Therefore, it is possible to prevent ammonia, which is a flammable gas, and oxygen, which is a combustion-supporting gas, from being mixed with each other, not only in the heat treatment apparatus 1, but also on the downstream side of the exhaust part 300.

<Modification>

While the preferred embodiments according to the present invention have been described hereinabove, various modifications of the present invention in addition to those described above may be made without departing from the scope and spirit of the invention. For example, in the aforementioned preferred embodiments, ammonia is used as a flammable gas, but the present invention is not limited to such a configuration, and the flammable gas may be hydrogen ($H_2$) or the like. Further, in the aforementioned preferred embodiments, oxygen is used as a combustion-supporting gas, but the present invention is not limited to such a configuration, and the combustion-supporting gas may be ozone ($O_3$), nitrous oxide ($N_2O$), or the like.

Further, in the aforementioned preferred embodiments, before and after supplying ammonia, which is a flammable gas, into the chamber 6, the evacuation of the chamber 6 and the nitrogen purge are performed. However, the evacuation of the chamber 6 and the nitrogen purge may be performed before and after supplying oxygen, which is a combustion-supporting gas, into the chamber 6. Specifically, before supplying oxygen, which is a combustion-supporting gas, into the chamber 6, the chamber 6 is evacuated to exhaust residual gas from the chamber 6, and then nitrogen is fed into the flammable gas line 261 to cause ammonia remaining in the flammable gas line 261 to flow out. Further, after supplying oxygen, which is a combustion-supporting gas, into the chamber 6, the chamber 6 is evacuated to exhaust ammonia from the chamber 6, and then nitrogen is fed into the combustion-supporting gas line 211 to cause oxygen remaining in the combustion-supporting gas line 211 to flow out.

In the third preferred embodiment, when the oxygen atmosphere in the chamber is replaced with the nitrogen atmosphere, the chamber 6 may be evacuated once to exhaust oxygen. Further, in the fourth preferred embodiment, before forming the oxygen atmosphere in the chamber 6 under the normal pressure, the chamber 6 may be evacuated once.

Although the 30 flash lamps FL are provided in the flash heating part 5 according to the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiments, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as the continuous lighting lamps to perform the preheating.

Further, in the aforementioned preferred embodiments, the semiconductor wafer W is heated by irradiation with light from the halogen lamps HL and the flash lamps FL. However, for example, the semiconductor wafer W may be heated with the semiconductor wafer W placed on a hot plate or in a high temperature atmosphere.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method of heating a substrate, said heat treatment method comprising the steps of:
   (a) putting a substrate into a chamber;
   (b) causing an exhaust part to exhaust gas from said chamber to eliminate residual gas from said chamber;
   (c) after said step (b), feeding nitrogen into a combustion-supporting gas line connected to said chamber to cause a combustion-supporting gas remaining in said combustion-supporting gas line to flow out therefrom and into said chamber;
   (d) after said step (c), supplying a flammable gas into said chamber through a flammable gas line connected to said chamber to form a flammable gas atmosphere;
   (e) heating said substrate in the flammable gas atmosphere;
   (f) after said step (e), causing said exhaust part to exhaust gas from said chamber to eliminate the flammable gas from said chamber; and
   (g) after said step (f), feeding nitrogen into said flammable gas line to cause the flammable gas remaining in said flammable gas line to flow out therefrom and into said chamber, wherein
   after a pressure in said chamber reaches a first pressure in said step (b), in said step (c), nitrogen and the combustion-supporting gas flow into said chamber, thereby increasing the pressure in said chamber from said first pressure, and
   after the pressure of said chamber reaches said first pressure in step (f), in said step (g), nitrogen and the flammable gas flow into said chamber, thereby increasing the pressure in said chamber from said first pressure.

2. The heat treatment method according to claim 1, further comprises the steps of:
   (h) supplying the combustion-supporting gas into said chamber through said combustion-supporting gas line to form a combustion-supporting gas atmosphere; and
   (i) heating said substrate in the combustion-supporting gas atmosphere.

3. The heat treatment method according to claim 2, wherein said step (h) and said step (i) are performed after said step (g).

4. The heat treatment method according to claim 2, wherein said step (h) and said step (i) are performed before said step (b).

5. The heat treatment method according to claim 2, wherein in said step (i), said substrate is heated in the combustion-supporting gas atmosphere under a normal pressure equal to atmospheric pressure.

6. The heat treatment method according to claim 2, wherein in said step (i), said substrate is heated in the combustion-supporting gas atmosphere under a reduced pressure lower than atmospheric pressure.

7. The heat treatment method according to claim 1, wherein in said step (e), said substrate is heated in the flammable gas atmosphere under a reduced pressure lower than atmospheric pressure.

8. The heat treatment method according to claim 1, wherein
   said flammable gas is ammonia or hydrogen, and
   said combustion-supporting gas is oxygen, ozone, or nitrous oxide.

9. A heat treatment apparatus for heating a substrate, said heat treatment apparatus comprising:
   a chamber for receiving a substrate therein;
   a heating part for performing heating treatment on said substrate received in said chamber;
   an exhaust part for exhausting gas from said chamber;
   a combustion-supporting gas line for supplying a combustion-supporting gas into said chamber;
   a first purge part for feeding nitrogen into said combustion-supporting gas line to cause the combustion-supporting gas remaining in said combustion-supporting gas line to flow out therefrom and into said chamber;
   a flammable gas line for supplying a flammable gas into said chamber; and
   a second purge part for feeding nitrogen into said flammable gas line to cause the flammable gas remaining in said flammable gas line to flow out therefrom and into said chamber, wherein
   said flammable gas is ammonia or hydrogen,
   before supplying the flammable gas into said chamber through said flammable gas line, said exhaust part exhausts gas from said chamber to eliminate residual gas from said chamber, and said first purge part feeds nitrogen into said combustion-supporting gas line to cause the combustion-supporting gas remaining in said combustion-supporting gas line to flow out, and
   after said exhaust part exhausts gas from said chamber and a pressure in said chamber reaches a first pressure, said first purge part feeds nitrogen into said combustion-supporting gas line to cause nitrogen and the combustion-supporting gas to flow into said chamber, thereby increasing the pressure in said chamber from said first pressure, after supplying the flammable gas into said chamber through said flammable gas line, said exhaust part exhausts gas from said chamber to eliminate the flammable gas from said chamber, and the second purge part feeds nitrogen into said flammable gas line to cause the flammable gas remaining in said flammable gas line to flow out, and after said exhaust part exhausts gas from said chamber and a pressure in said chamber reaches a first pressure, said second purge part feeds nitrogen into said flammable gas line to cause nitrogen and the flammable gas to flow into said chamber, thereby increasing the pressure in said chamber from said first pressure.

10. The heat treatment apparatus according to claim 9, wherein said combustion-supporting gas is oxygen, ozone, or nitrous oxide.

* * * * *